United States Patent [19]

Hale

[11] 4,393,392

[45] Jul. 12, 1983

[54] HYBRID TRANSISTOR

[75] Inventor: Raymond L. Hale, Torrance, Calif.

[73] Assignee: Power Hybrids, Incorporated, Torrance, Calif.

[21] Appl. No.: 162,124

[22] Filed: Jun. 23, 1980

[51] Int. Cl.³ .................... H01L 23/02; H01L 27/02; H01L 23/48

[52] U.S. Cl. ...................................... 357/74; 357/51; 357/68; 357/81; 333/247

[58] Field of Search ....................... 357/74, 81, 68, 51; 333/247

[56] References Cited

U.S. PATENT DOCUMENTS

| | | | |
|---|---|---|---|
| 3,713,006 | 1/1973 | Litty et al. | 357/81 |
| 3,886,505 | 5/1975 | Jacobson | 357/74 |
| 3,969,752 | 7/1976 | Martin et al. | 357/51 |
| 4,023,198 | 5/1977 | Malone et al. | 357/74 |
| 4,213,141 | 7/1980 | Colussi | 357/74 |

Primary Examiner—Andrew J. James
Assistant Examiner—E. D. Burnside
Attorney, Agent, or Firm—Ellsworth R. Roston; Charles H. Schwartz

[57] ABSTRACT

A transistor package having input, reference (ground) and output terminals includes a ceramic base metallized to provide a ground plane and an isolated collector pad; and also includes a transistor die disposed on the pad. An equivalent output circuit of the transistor die describes an output impedance having a capacitive reactance. Pairs of wires are connected from the ground plane to the collector pad in series with DC blocking capacitors to provide an inductive reactance in parallel with the capacitive reactance of the transistor die. The pairs of wires are disposed in a transverse, preferably a substantially perpendicular, relationship and are connected to the collector pad at distributed, preferably uniformly distributed, positions along such area. This provides for a substantially uniform distribution of current throughout the transistor die and a substantially uniform junction temperature throughout the die. The value of the inductive reactance is chosen to resonate with the capacitive reactance of the transistor die at a frequency dependent upon the range of frequencies in which the transistor package will be operating. In this way, the output impedance of the transistor package is increased and the efficiency in the operation of the transistor package is enhanced.

21 Claims, 5 Drawing Figures

HYBRID TRANSISTOR

The present invention relates generally to semiconductor or transistor packages and more specifically to transistor packages which are adapted to provide signal outputs at high power levels and high frequencies.

Significant advances in modern technology have increased the demand for semiconductor or transistor packages which are capable of providing output signals at high power levels and at high frequencies. This demand has also made it desirable to provide the semiconductor or transistor packages with a lower Q, which corresponds to a wider bandwidth. The wider bandwidth enables the semiconductor or transistor packages to accommodate additional data channels. Such additional data channels significantly increase the data throughput of the semiconductor or transistor packages. Furthermore, it is always desirable to decrease the internal losses of the semiconductor or transistor packages since any power dissipated in the semiconductor or transistor packages reduces the total power provided at the output of the semiconductor or transistor packages. It is also desirable to increase the gain and efficiency of the semiconductor or transistor packages.

The semiconductors of the prior art have typically had low output impedances. These semiconductors have commonly been used with transmission line systems and antenna systems which have a nominal impedance of fifty (50) ohms. In order to match semiconductors to these systems and minimize the losses associated with the matching, elaborate impedance matching networks have been interposed between the semiconductors and the associated systems. These impedance matching networks have increased the output impedance of the semiconductors to provide an improved match with the impedance of the associated systems.

Typically, the output impedance for a high power semiconductor has been between one (1) and five (5) ohms. In order to match this impedance to a nominal fifty (50) ohm level, the impedance matching networks have typically increased the output impedance of the device by a factor of ten (10) to fifty (50). By providing the semiconductors with a high output impedance, the output current is reduced. Reduced output currents result in reduced power losses within the semiconductors.

The use of external impedance matching networks, especially tunable networks, has significantly increased the cost of a high frequency amplifier. Also, due to the inclusion of additional components to provide the impedance matching at the output, the overall reliability of the combination has been reduced while the size has been increased.

The bandwidth limitation, the internal losses and the impedance matching characteristics of the semiconductors are related to certain parasitic reactances within the transistor package. Of particular interest in the present invention are those parasitic reactances which inherently occur in the output of the transistor die and package.

The transistor die has a certain amount of inherent capacitance. This inherent capacitance increases directly with the power and the size of the transistor die. This inherent capacitance has a shunt effect when considered from an electrical standpoint in the virtual circuitry defined by the semiconductor. This shunt capacitance has tended to provide low output impedances at high frequencies such as frequencies in the gigahertz range In combination, these parasitic quantities result in an equivalent circuit including a relatively low value of series resistance and relatively high value of series reactance. The relatively low value of the series resistance reduces the magnitude of the output impedance so that significant transformations have been required by an external matching network.

As previously described, the low output impedances of the semiconductors of the prior art, particularly in the gigahertz range, have caused relatively high output currents to be produced. As a consequence, the power losses in the transistor packages have been relatively high.

In U.S. Pat. No. 3,969,752 assigned of record to the assignee of record of this application, a transistor package has been provided with a relatively high output impedance which decreases the complexity of the associated impedance matching networks and also reduces the magnitude of the output current. By reducing the output current, the internal losses in the transistor package have been significantly reduced.

Of particular advantage to the transistor packages disclosed and claimed in U.S. Pat. No. 3,969,752 has been a substantial increase in the bandwidth of the transistor package. In some embodiments, the bandwidth of the device has actually been doubled. This has not only doubled the number of data channels that can be accommodated by a single transistor package but has also provided a significant increase in the data throughput of the system.

In accordance with several embodiments disclosed and claimed in U.S. Pat. No. 3,969,752, an internal inductance has been connected in parallel with the shunt capacitance of the transistor die and provided with a value such that the inductive reactance has been substantially equal to the capacitive reactance at a particular frequency close to the range of frequencies in which the transistor package is operative. Under these conditions, the shunt capacitance and the parallel inductance have resonated at the particular frequency. These quantitites have provided an output impedance which has been greater than in the semiconductors of the prior art. This increased impedance has reduced the current in the output circuit so that the power losses internally of the transistor package have been significantly reduced. Furthermore, the bandwidth of the transistor package has been increased.

The parallel inductance has been provided in the transistor packages of U.S. Pat. No. 3,969,752 in accordance with various embodiments of the invention. The inductance in the reactance branch has been provided by a lumped tuning wire or a plurality of wires or a high impedance transmission line connected to a collector pad on the ceramic body.

Although the gain and efficiency of transistor packages have been considerably enhanced by the improvements disclosed and claimed in U.S. Pat. No. 3,969,752, some inefficiency and reduction in optimal gain of the transistor package have still occurred. Such inefficiency and loss in gain have been found by considerable testing and close analysis to result from the connections of the wires providing the inductance in the reactance branch which has been added in U.S. Pat. No. 3,969,752 to be connected in parallel with the shunt die capacitance to substantially common positions on the collector pads. Because of the connections of the wires to common positions on the collector pads, currents have been concentrated at such common positions. This has tended to limit the flow of current through the collector and has accordingly tended to limit the gain of the transistor. It has also tended to produce hot spots in the transistors. Such hot spots have further tended to limit the flow of current through the collector and accordingly, the gain of the transistor.

This application discloses and claims a transistor package which overcomes the disadvantages set forth in the previous two paragraphs. In the transistor package of this invention, wires are connected from a collector pad to form an inductance at the output of the transistor package as in U.S. Pat. No. 3,969,752. However, pairs of wires are disposed in a transverse, preferably a substantially perpendicular, relationship to minimize the coupling between the wires. Furthermore, the wires are connected to the collector pad at positions distributed, preferably substantially uniformly distributed, along the collector pad.

In this way, the current flowing through such inductance and through the collector pad is more evenly distributed than in the transistor packages of U.S. Pat. No. 3,969,752. This eliminates hot spots and current concentrations that sometimes may occur in the transistor packages of U.S. Pat. No. 3,969,752. It provides for a uniform distribution of the current flowing through the transistor die. It also provides for an increase in the gain and efficiency of the transistor package. It further provides for an increase in the bandwidth of the frequencies which can be effectively amplified by the transistor package.

Although the specification concludes with claims particularly pointing out and distinctly claiming the subject matter which is regarded as the invention, it is believed that the invention, and the objects, features and advantages of such invention, will be fully understood from the following description taken in connection with the accompanying drawings.

IN THE DRAWINGS

Figure 1:
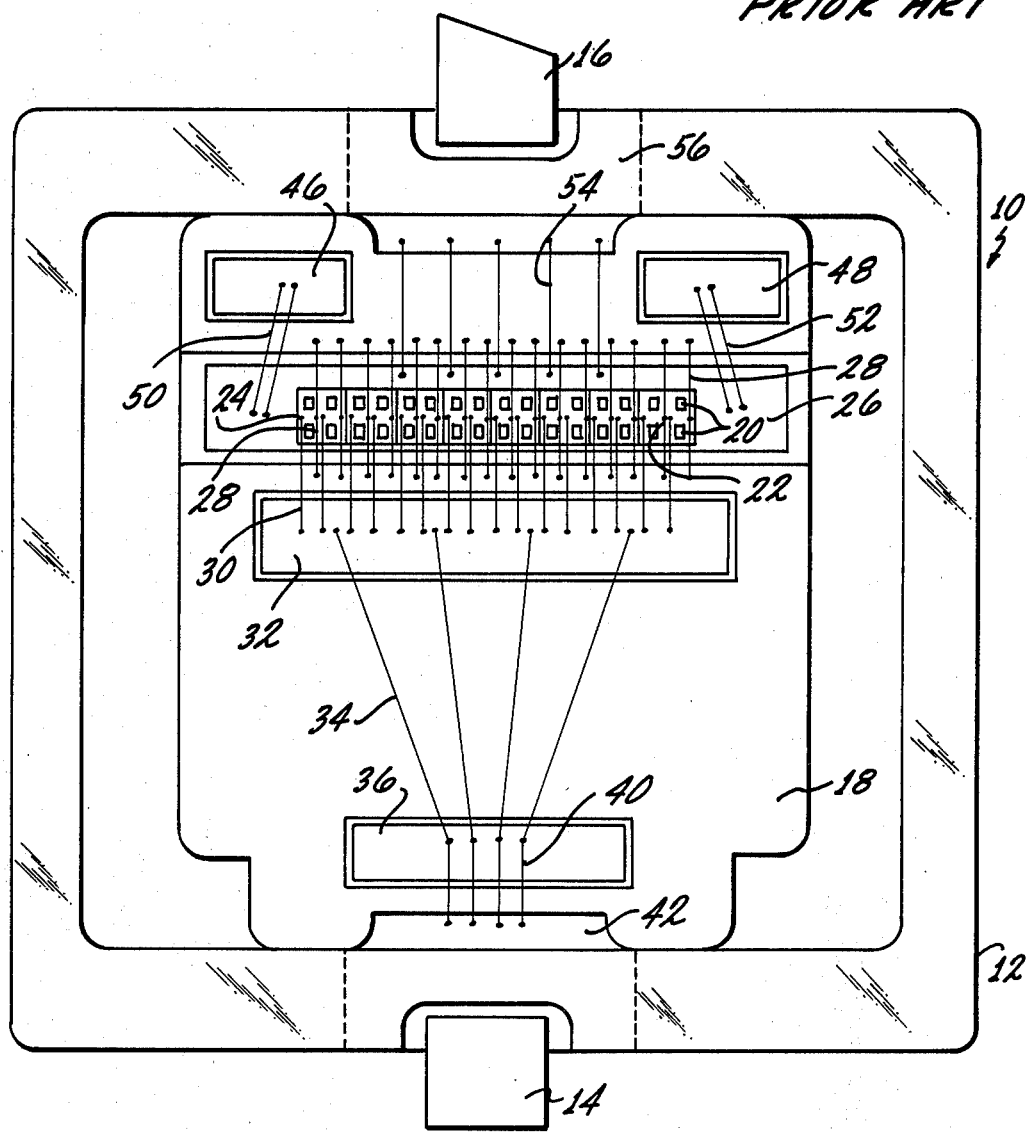
FIG. 1 is a top plan view of a transistor package constituting the prior art.

A transistor or transistor package is generally illustrated at 10 in FIG. 1. The transistor package 10 includes a main body member 12 which preferably has a ceramic composition such as a beryllium oxide composition and provides a primary support. The transistor package 10 incorporates the improvements disclosed and claimed in U.S. Pat. No. 3,969,752 issued on July 13, 1976 to John R. Martin and Vahan Garboushian and assigned of record to the assignee of record of this application.

The transistor package 10 includes a pair of terminals 14 and 16 at opposite ends of the package. The terminal 14 constitutes an input terminal and the terminal 16 constitutes an output terminal. An electrically conductive area 18 defining a reference potential such as ground is provided on a surface of the transistor package. An isolated pad 26 is also disposed on the body member 12 in spaced relationship to the pad 18.

A plurality of transistor cells 20 are disposed on the pad 26. The transistor includes base bonding pads 22 and emitter bonding pads 24. The transistor cells 20 also include collectors having a common connection with the pad 26. The transistor cells 20 may be constructed in a conventional manner and may be disposed on the body member 10 in a conventional manner.

Electrical leads 28 are connected between the bases 22 and the reference area 18. Electrical leads 30 are connected between the emitters 24 and a first plate of a capacitor 32, the second plate of which is in electrical contact with area 18. Leads 34 have connections at first ends with the capacitor 32 and have connections at their opposite ends with a first plate of a capacitor 36, the second plate of which is in electrical contact with the reference area 18. Wires 40 are connected from the first plate of the capacitor 36 to an emitter ledge 42 which is connected in a conventional manner to the terminal 14.

A pair of capacitors 46 and 48 are provided on the body member 12 in adjacent but spaced relationship to the collector pad 26. The capacitors 46 and 48 may be disposed at the opposite sides of the body member 12 and may be in symmetrical relationship to the body member. The capacitors are provided with second plates in electrical contact with the reference area 18. The capacitors 46 and 48 are provided with first plates which are respectively connected to first ends of wires 50 and 52. The second ends of the wires 50 and 52 are connected to the collector pad 26. Wires 54 also extend electrically between the collector pad 26 and a collector ledge 56. The collector ledge 56 is connected in a conventional manner to the terminal 16.

Figure 3:
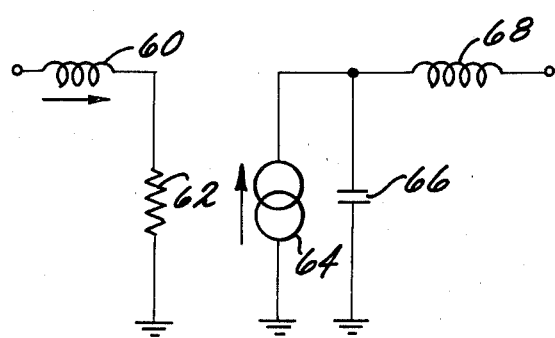
FIG. 3 is an equivalent electrical diagram of the transistor die shown in FIGS. 1 and 2.

FIG. 3 illustrates an equivalent circuit for the transistor die. This equivalent circuit includes an input circuit formed by an inductance 60 and a resistance 62 in series. It also includes an output circuit including a generator 64, a shunt capacitance 66 and a series inductance 68. One terminal of the resistance 62, the generator 64 and the capacitance 66 is connected to the reference terminal such as ground.

Figure 4:
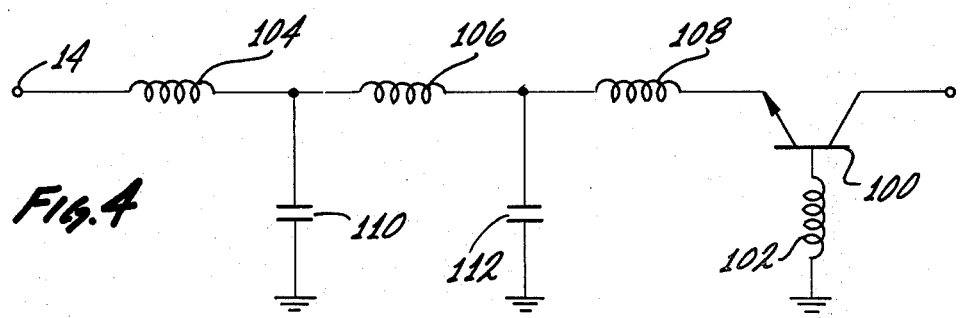
FIG. 4 is an equivalent electrical diagram of the input circuitry of the transistor package shown in FIGS. 1 and 2.
Figure 5:
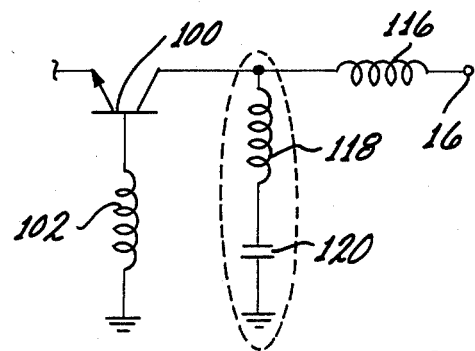
FIG. 5 is an equivalent circuit diagram of the output circuitry of the transistor package shown in FIGS. 1 and 2.

The transistor package shown in FIG. 1 and described above is adapted to operate at relatively high frequencies such as frequencies in the range of one (1) to four (4) Gigahertz. At these frequencies, the wires serve as inductances. Thus, the transistor package 10 can be considered to provide equivalent electrical circuits such as shown in FIGS. 4 and 5. The circuitry shown in FIG. 4 illustrates the equivalent input circuitry to the transistor and the circuitry shown in FIG. 5 illustrates the equivalent output circuitry from the transistor.

The equivalent electrical circuit shown in FIG. 4 includes a transistor 100 with an emitter, a base and a collector. The transistor 100 may be considered as the equivalent of the combination of the transistor cells 20 in FIG. 1. As will be seen in FIG. 3, the base of the transistor 100 is shown as being connected electrically to the reference such as ground although an inductance 102 of relatively small value may be considered as being included between the base and the reference such as ground.

The equivalent circuit shown in FIG. 4 also includes the input terminal 14. Inductances 104, 106 and 108 may be considered as being connected in series between the input terminal 14 and the emitter of the transistor 100.

The inductance 104 may be considered as being formed by the wires 40 and the ledge 42. The inductances 106 and 108 may be respectively considered as being formed by the wires 34 and 30.

A capacitance 110 may be considered as being connected between the terminal common to the inductances 104 and 106 and the reference potential such as ground. Similarly, a capacitance 112 may be considered as being disposed electrically between the terminal common to the inductances 106 and 108 and the reference potential such as ground. The capacitance 110 may be considered to be defined by the capacitance 36 in FIG. 1 and the capacitance 112 may be considered to be defined by the capacitance 32. As is well known in the prior art, the inductances 104, 106 and 108 and the capacitances 110 and 112 tend to enhance the operation of the transistor package by materially increasing the input impedance.

The equivalent circuit shown in FIG. 5 also includes the output terminal 16. A series inductance 116 may be considered to be disposed electrically between the collector of the transistor 100 and the output terminal 16. The inductance 116 may be considered as being formed by the wires 54 and the collector ledge 56. An inductance 118 and a capacitance 120 may be considered as being connected in series between the collector of the transistor 100 and the reference such as ground. The inductance 118 may be considered to be defined primarily by the wires 50 and 52 and the capacitance 120 may be considered to be defined primarily by the capacitors 46 and 48. The capacitance 120 is included primarily to block direct currents from flowing through the series branch including the inductance 118 and the capacitance.

The inductance 118 and the capacitance 66 define a parallel resonant circuit. The resonant frequency of this resonant circuit preferably approaches, but is less than, the range of frequencies in which the transistor package will be operating. For example, the resonant frequency of the inductance 118 and the capacitance 66 may be approximately fourteen hundred and fifty (1450) megahertz when the range of operative frequencies of the transistor package is between fifteen hundred (1500) megahertz and seventeen hundred (1700) megahertz.

As efficient as the transistor package 10 of FIG. 1 may be, it has been discovered that there are limitations in this design. For example, since the pairs of the wires 50 and 52 are connected to the collector pad 26 in relatively close proximity, the current tends to become localized at the positions of connection of the wires to the collector pad 26. This tends to limit the magnitude of the current that can flow through the collector of the transistor 100. The connections of the wires to the collector pad 26 in close proximity also tend to produce hot spots at these positions of connection. This further tends to limit the magnitude of the current that can flow through the collector of the transistor 100.

Figure 2:
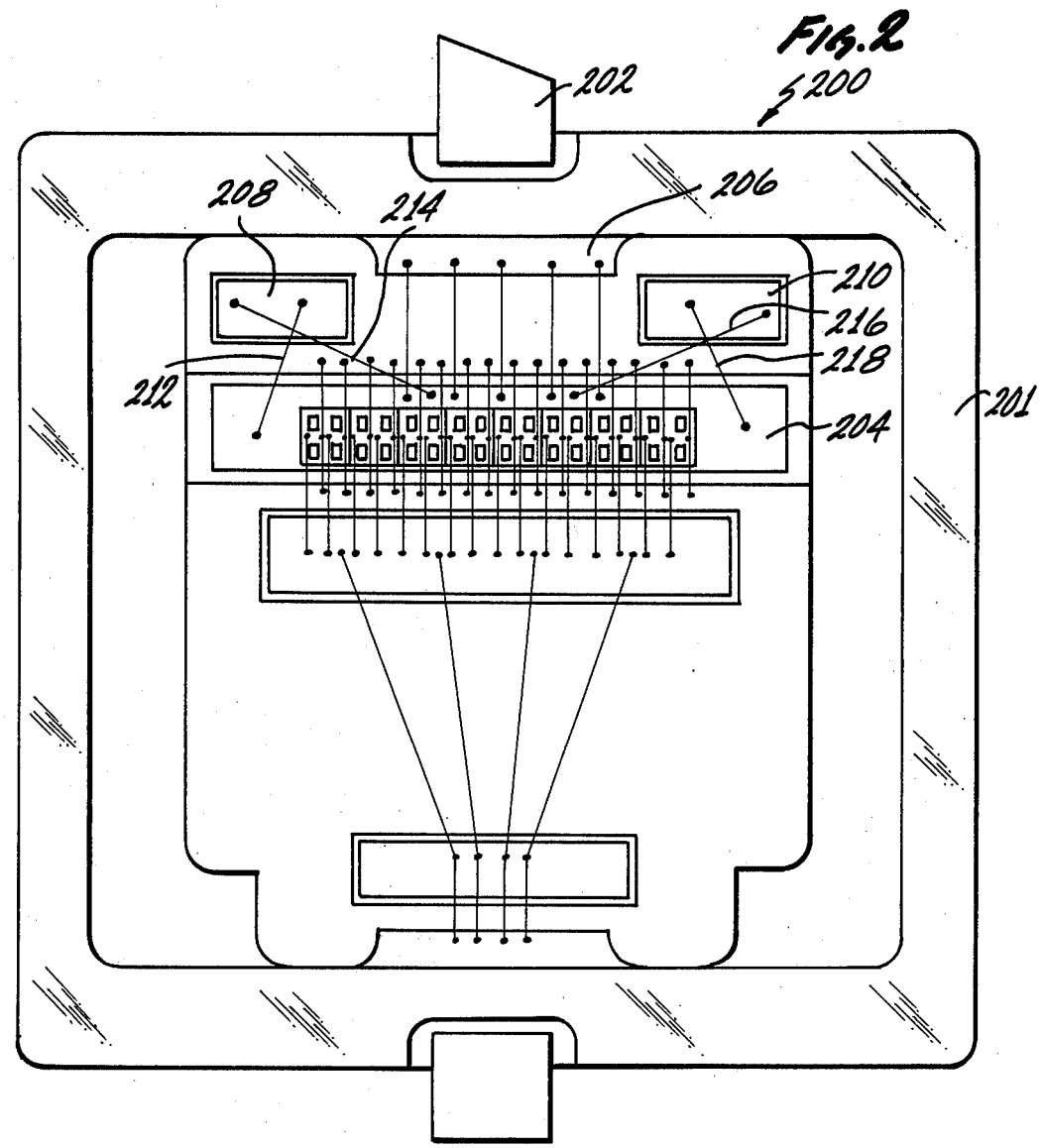
FIG. 2 is a top plan view of a transistor package which includes the features providing the advantages of this invention.

FIG. 2 shows an improved transistor package which avoids the limitations and problems discussed above. This transistor package is generally indicated at 200 and is provided with a construction quite similar to that shown in FIG. 1 and described above. The transistor package 200 includes a body member 201, an output terminal 202, a collector pad 204, a collector ledge 206 and a pair of capacitors 208 and 210 respectively corresponding to the body member 12, the output terminal 16, the collector pad 26, the collector ledge 56 and the capacitors 46 and 48 shown in FIG. 1.

The embodiment shown in FIG. 2 includes wires 212 and 214 connected from the collector pad 26 to the capacitor 208 and wires 216 and 218 connected from the collector pad 26 to the capacitor 210. The wires 212, 214, 216 and 218 are preferably short (but longer than those in the embodiment of FIG. 1) and disposed in close proximity to the surface of the body member 201. The wires may be thin gold bond wires with a diameter typically in the order of one half (0.5) to two and one half (2.5) mils.

The connections of the wires 212, 214, 216 and 218 to the collector pad 204 are distributed throughout the length of the pad. Preferably, these connections are as uniformly distributed as possible throughout the length of the collector pad 204. The wires 212 and 214 are disposed in transverse relationship to each other to minimize the capacitive effect and the inductive coupling between the wires. Preferably, the wires 212 and 214 are substantially perpendicular to each other to minimize coupling between the wires. The same relationship exists between the wires 214 and 216.

The relationship shown in FIG. 2 and described above has certain important advantages. It provides for an even distribution of current throughout the transistor die. This assures that the current in the different cells in the transistor die will be substantially uniform. It also assures that the current in the transistor die will not become saturated at a relatively low value. In this way, the magnitude of the current in the collector pad 204 may not be limited as it may be in the collector pad of FIG. 1. Furthermore, since the current in the collector pad 204 is substantially uniformly distributed in the embodiment of FIG. 2, no hot spots are produced as sometimes occurs in the embodiment of FIG. 1. This further assures that the current in the collector pad 204 will not be limited as sometimes occurs in the embodiment of FIG. 1.

As a result of enhanced current flow in the collector pad 204 and the production of a substantially uniform and relatively low temperature in the pad, the transistor package of FIG. 2 is able to operate at an increased efficiency and gain in comparison to the efficiency and gain of transistor packages of the prior art. For example, an increase in power gain of one decibel (1 db) has been common. Furthermore, increases in efficiency as great as ten percent (10%) have been obtained in the transistor package of FIG. 2 relative to the transistor package of FIG. 1. The bandwidth of the transistor package of FIG. 2 has also been extended relative to the bandwidth of the transistor package of FIG. 1. This has resulted from the increase in gain and efficiency and the reduction in the power losses of the transistor package of FIG. 2 relative to the transistor package of FIG. 1.

The increases in gain and efficiency in the transistor package of FIG. 2 are particularly significant since the transistor package of FIG. 1 provides considerable increases in efficiency and gain over the embodiments in existence prior to the adoption of the improvements in the transistor package of FIG. 1. The embodiment of FIG. 2 is also advantageous because the collector current of this transistor package is more consistent in the transistor cells 20 than in the prior art including the embodiment of FIG. 1.

Although this application has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. A transistor package for enhancing the power output from a transistor die in a particular range of operating frequencies, including:
   a body member;
   a thin metallic layer disposed on the body member to define a pad for a first electrode in the transistor package;
   a transistor die disposed on the pad and defining a pair of additional electrodes in the package;
   the transistor die and the metallic layer being constructed and disposed on the body member to provide, in an equivalent output circuit, characteristics including a capacitive reactance;
   means supported on the body member to define an inductive reactance in a parallel relationship with the capacitive reactance;
   the inductive reactance being resonant with the capacitive reactance at a particular frequency, dependent upon the operating range of frequencies, to increase the output impedance of the transistor package; and
   the means defining the inductance reactance being formed by at least a pair of wires connected to the pad for the first electrode at distributed positions along the pad and being disposed in transverse relationship to each other.

2. The transistor package recited in claim 1 wherein capacitors are formed on the body in displaced relationship to the transistor die and in displaced relationship to each other and wherein the wires forming the inductive reactance are connected at one end to the pad at progressively distributed positions along the pad to distribute throughout the pad the heat produced by the flow of current through the pad and are connected at the other end to the capacitors.

3. The transistor package recited in claim 1 wherein the wires forming the inductive reactance are formed from pairs of wires disposed at substantially uniformly distributed positions along the length of the pad and wherein the wires in each pair are disposed in substantially perpendicular relationship to each other.

4. The transistor package recited in claim 1 wherein a second metallic layer is disposed on the body member in electrically insulated relationship to the first layer to define a reference potential and one of the additional electrodes is disposed to receive this reference potential and the pairs of wires defining the inductive relationship have a relative disposition approaching a substantially perpendicular relationship.

5. The transistor package recited in claim 1 wherein capacitors are disposed on the body member at spaced positions on the body member and the means defining the inductive reactance comprises at least pairs of wire connected between each of the capacitors and the pad and extending in transverse relationship between the capacitors and substantially uniformly distributed positions on the pad.

6. The transistor package recited in claim 5 wherein a second metallic layer on the body member defines a reference potential for another one of the electrodes in the transistor die and wherein means are provided on the body member to define capacitances and wherein pairs of wires defining the inductance are connected to the capacitances and the thin metallic layer defining the pad at spaced positions along the pad.

7. A transistor package having an operating range of frequencies, including:
   a body member;
   a plurality of metallized elements disposed on the body member in spaced relationship to one another and defining terminals including an input terminal, an output pad and a reference area;
   a transistor die disposed on the body member and defining a transistor and having at least one input electrode connected to the input terminal and at least one reference electrode connected to the reference area,
   the transistor die and the metallized elements being constructed and disposed relative to one another on the body member to define an equivalent output circuit having a capacitive reactance;
   first means disposed on the body member in contiguous but spaced relationship to the metallized elements to define a capacitance; and
   second means including a plurality of wires disposed on the body member and connected electrically to the first means and the metallized element defining the output pad to define an inductance in series with the capacitance,
   the first means and the second means being constructed to provide a resonance with the capacitive reactance in the equivalent output circuit at a particular frequency dependent upon the operating range of frequencies,
   the wires in the plurality being connected at one end to the first means and at the other end to the metallized element defining the output pad, the different wires in the plurality being distributed along such metallized element at their connections to such metallized element and being disposed in transverse relationship to one another.

8. The transistor set forth in claim 7 wherein the wires in the plurality are disposed in spaced pairs and the wires in each pair are disposed in substantially perpendicular relationship to each other.

9. The transistor recited in claim 7 wherein the first means is defined by at least a pair of thin conductive films disposed on the body member at spaced positions on the body member and the second means is provided by pairs of electrical wires, each pair being connected at one end to one of the thin conductive films in the first means and connected at the other end to the metallized element defining the output pad in distributed relationship to the connections of the other wires to the output pad.

10. The transistor recited in claim 7 wherein the first means is defined by at least a pair of conductive films disposed on the body member in spaced relationship to each other and in spaced and symmetrical relationship to the metallized element defining the output pad and the wires in the plurality are connected in pairs to each of the conductive films and the wires in each pair are disposed in transverse and distributed relationship to each other and in spaced relationship to the wires in the other pair.

11. The transistor set forth in claim 10 wherein the first means is defined by at least a pair of thin films disposed on the body member in a symmetrical relationship at opposite ends of the transistor die.

12. The transistor set forth in claim 11 wherein the connections of the wires in the plurality are substantially uniformly distributed along the metallized element defining the output pad.

13. The transistor set forth in claim 12 wherein the conductive films defining the first means are disposed adjacent the metallized element defining the output pad and the wires in the plurality are disposed in contiguous relationship to the body member and in a short path between the conductive films and the metallized element.

14. A transistor package for enhancing the power output from a transistor die in a particular range of operating frequencies, including:
   a body member,
   a conductive pad on the body member,
   a transistor die on the conductive pad, the transistor die having input, output and reference electrodes, the transistor die being constructed to provide a capacitive reactance in its output, the output electrode being disposed in electrical communication with the conductive pad,
   at least one capacitor disposed on the body member in spaced relationship to the conductive pad, and
   at least a pair of leads extending to the capacitor from spaced positions on the pad and disposed in transverse relationship to each other.

15. A transistor package as set forth in claim 14 wherein
   at least a pair of capacitors are disposed on the body member in spaced relationship to the conductive pad and in spaced relationship to each other, and wherein
   pairs of leads extend to the capacitors from the conductive pad and wherein the leads in each pair are disposed in transverse relationship to each other and wherein the leads are connected to the pad at distributed positions along the pad.

16. A transistor package as set forth in claim 15 wherein
   the capacitors are disposed in a symmetrical relationship with the extremities of the transistor package and wherein the leads in each pair are disposed in substantially perpendicular relationship to each other.

17. A transistor package as set forth in claim 16 wherein
   the leads define an inductance in series with the capacitors and in parallel with the capacitive reactance and wherein the inductance, the capacitors and the capacitive reactance define a parallel circuit resonant at a frequency dependent upon the particular range of operating frequencies.

18. A transistor package for enhancing the power output from the transistor die in a particular range of operating frequencies, including,
   a body member,
   a conductive pad on the body member,
   a transistor die on the conductive pad, the transistor die having input, output and reference electrodes, the transistor die being constructed to provide a capacitive reactance in its output,
   a reference pad on the body member in spaced relationship with the conductive pad, and
   at least a pair of leads having first and second ends and communicating electrically at the first ends with the reference pad and connected at the second ends with the conductive pad at distributed positions along the conductive pad and disposed in transverse relationship to each other.

19. A transistor package as set forth in claim 18 wherein pairs of leads have first and second ends and communicate electrically at the first ends with the reference pad and at the second ends with the conductive pad at substantially uniformly distributed positions along the conductive pad and wherein the leads in each pair are disposed in transverse relationship to each other.

20. A transistor package as set in claim 10 wherein
   the leads in each pair are disposed in substantially perpendicular relationship to each other.

21. A transistor package as set forth in claim 19 wherein
   the leads define an inductance in parallel with the capacitive reactance and wherein the parallel circuit is resonant at a frequency dependent upon the particular range of operating frequencies.

* * * * *